(12) United States Patent
Chung et al.

(10) Patent No.: US 7,994,524 B1
(45) Date of Patent: Aug. 9, 2011

(54) VERTICALLY STRUCTURED LED ARRAY LIGHT SOURCE

(76) Inventors: David Yaunien Chung, Los Angeles, CA (US); Thomas Taoming Chung, Redondo Beach, CA (US)

( * ) Notice: Subject to any disclaimer, the term of this patent is extended or adjusted under 35 U.S.C. 154(b) by 766 days.

(21) Appl. No.: 11/900,576

(22) Filed: Sep. 12, 2007

(51) Int. Cl.
*H01L 33/48* (2010.01)

(52) U.S. Cl. ..... 257/90; 257/88; 257/100; 257/E33.058; 257/E25.02; 257/E25.021

(58) Field of Classification Search .............. 257/88, 257/89, 90, 100, E33.048, E33.056, E33.058, 257/E33.061, E33.066, E33.067, E33.069, 257/E27.12, E27.121, E25.019, E25.02, E25.021
See application file for complete search history.

(56) References Cited

U.S. PATENT DOCUMENTS

| | | | |
|---|---|---|---|
| 5,583,350 A * | 12/1996 | Norman et al. ............. | 257/88 |
| 5,793,405 A | 8/1998 | Shakuda | |
| 5,893,721 A | 4/1999 | Huang | |
| 5,965,907 A * | 10/1999 | Huang et al. ............... | 257/89 |
| 6,136,623 A * | 10/2000 | Hofstetter et al. ........... | 438/28 |
| 6,329,676 B1 | 12/2001 | Takayama | |
| 6,506,087 B1 * | 1/2003 | Fushimi et al. ............. | 445/24 |
| 6,791,119 B2 | 9/2004 | Slater, Jr. | |
| 6,885,035 B2 * | 4/2005 | Bhat et al. ................. | 257/99 |
| 6,964,877 B2 | 11/2005 | Chen et al. | |
| 7,055,987 B2 | 6/2006 | Stanfest | |
| 7,170,100 B2 | 1/2007 | Erchak et al. | |
| 7,295,029 B2 | 11/2007 | Zhao | |
| 2003/0001492 A1 * | 1/2003 | Pei et al. .................. | 313/496 |
| 2004/0184502 A1 * | 9/2004 | Miyachi et al. ............. | 372/50 |
| 2004/0232812 A1 * | 11/2004 | Beeson et al. .............. | 313/110 |
| 2005/0243243 A1 * | 11/2005 | Koganezawa ............... | 349/62 |
| 2006/0180818 A1 * | 8/2006 | Nagai et al. ............... | 257/89 |
| 2007/0228935 A1 * | 10/2007 | Kim et al. ................. | 313/503 |
| 2007/0237200 A1 * | 10/2007 | Ryu et al. ................ | 372/50.122 |
| 2009/0108269 A1 * | 4/2009 | Negley et al. .............. | 257/88 |

FOREIGN PATENT DOCUMENTS

DE 19631907 A1 * 2/1998
JP 58220469 A * 12/1983

OTHER PUBLICATIONS

Peternai, Lorant. "Investigation of Structures Using GaNxP1-x Active Layers." IEEE International Students and Young Scientists Workshop "Photonics and Microsystems," pp. 41-42. 2004.*

* cited by examiner

*Primary Examiner* — Leonardo Andújar
*Assistant Examiner* — Christopher M Roland
(74) *Attorney, Agent, or Firm* — David A. Belasco; Belasco Jacobs & Townsley, LLP

(57) ABSTRACT

A vertical structured Light Emitting Diode (LED) array using wafer level bonding. The process bonds two or more LED arrays vertically to produce light mixing in a small footprint. The vertically bonded LED array contains through substrate vias and a plurality of metal posts coated with solder to form an internal cavity between the LED layers. This LED array structure is intrinsically hermetically sealed.

6 Claims, 11 Drawing Sheets

VERTICALLY STRUCTURED LED ARRAY LIGHT SOURCE

BACKGROUND OF THE INVENTION (1) Field of the Invention

This invention relates to light emitting diode (LED) arrays, specifically high intensity LED arrays, to be used as a solid state light (SSL) source.

(2) Description of the Related Art

Currently, a white SSL source using Gallium Nitride (GaN) semiconductor power chips with a phosphor coating can generate 50-100 lumens per watt at the device level, and deliver 35-70 lumens per watt as a light source. Individual units, up to a 30-40 W range, have been produced since 2005 with a maximum light flux approaching 1400 lumens.

One approach for producing high intensity LED sources has been to group many LEDs in an array form. U.S. Pat. No. 5,793,405 to Y. Shakuda shows a linear LED chip array arranged as a print head. U.S. Pat. No. 7,055,987 to G. Staufert shows a two dimensional LED array in a luminous panel. Lamina Ceramics of Westampton, N.J. produced a flat panel of 50 LED assemblies, each powered at 28 W that reached 1400 W with a light flux output of 28,000 lumens. (LED Magazine, October 2005). This was a demo unit that never made it to production. These examples show that arrays of individual LED devices in a simple tile arrangement can be combined to create a high intensity kilo-lumen (KL) light source. However, because of the low efficiency (20-30 lumens per watt) of the individual LED sources, these panels tend to be bulky, heavy, and produce excessive heat. These elements pose serious problems at higher wattages. To understand these problems, it is necessary to explain how a LED creates white light.

The most common means to obtain white light in a LED is to mix blue and yellow light. FIG. 1 shows an emission of white light using a prior art blue LED combined with a yellow phosphor, described by U.S. Pat. No. 6,791,119 to Slater, Jr. et al. The process is as follows: a YAG (yttrium aluminum garnet) phosphor 1 is formed on the top of a blue LED 2 having an InGaN/GaN structure. In this structure, a current is injected from a lead frame 3 with a reflector cup 4 through a conductor 5 to the LED chip 2, which activates and emits blue light. The remaining current flows out to another lead frame 6. The blue light in turn excites the YAG phosphor, which emits a yellow fluorescence light. The mixture of the blue emission from the LED chip and the yellow emission from the phosphor results in a multidirectional white emission. An epoxy lens 7 improves the external emission efficiency of the white light.

So, to obtain a white light source panel having a large area, it is necessary to use a large number of LED chips. In FIG. 2, a series of three LED chips 2b, 2c, 2d are shown. In this structure, current is injected from a lead wire 6b through a connector post 5b to the LED chip 2b, which activates and emits blue light. The current flows through wire 3b and conductor post 5c to activate LED chip 2c. The current continues to flow through wire 3c and conductor post 5d to activate LED chip 2d. The remaining current continues to flow out to lead wire 3d. For the prior art design shown in FIG. 2, the driving circuit becomes complicated and the fabrication cost becomes high. Moreover, it is difficult to use a large number of prior art LEDs to provide a white light panel having uniformly distributed light emission. Further, while a thin lighting panel is preferred, as shown in FIGS. 1 and 2, the thickness and lateral dimension of the panel become large because of the thermal management requirement.

The biggest problem with a high intensity LED array is difficulty of thermal (and consequently power) control. At high wattages, LED junction temperature can limit luminosity, since light emission decreases dramatically as junction temperature increases. To reduce the junction temperature, it is necessary to provide a shorter heat conduction path between the LED junction and the metallic back plane and use high thermal conductivity materials as substrates or heat sinks. The package for an LED array light source may contain a bulky heat sink and cooling fan to keep the junction temperature in its working range, which is typically around 125° C.

Two methods of solving these intensity limiting problems exist: the matrix and flip chip approaches. The matrix approach uses many lower power LEDs to generate the needed light intensity. U.S. Pat. No. 5,893,721 to R. T. Huang et al. mentions a method of manufacturing an Active Matrix LED at a wafer level with GaAs, SiC, sapphire, and amorphous silicon. U.S. Pat. No. 6,329,676 to T. Takayama describes a method of using thin film strips of InGaN and GaN to form a mosaic of LED junctions for an effective flat panel source. An intrinsic difficulty in these approaches is that the parallel circuitry requires a high current density. So to minimize junction temperature rise, the size of the LED matrix is limited.

The best thermal management method for an LED array employs flip-chip bonding of LEDs to a ceramic sub-mount. U.S. Pat. No. 6,885,035 to Bhat et als describes a multi-chip LED semiconductor approach that bonds multiple LEDs to a sub-mount wafer using this flip-chip method. U.S. Pat. No. 6,964,877 to Chen et al. describes an LED power package using another flip-chip bonding method. U.S. Pat. No. 7,170,100 to Erchak et al. describes packaging for an LED array using various flip chip sub-mount designs. The total number of chips that can be bonded is limited to 4-6 by the practicality of applying phosphor, bonding the epoxy lens, etc. Therefore, using a 6-chip packaging as an example, the maximum luminous intensity achievable is 600 lumens with a LED device efficiency of 100 lumens per watt.

Development of an LED array which has a small footprint and yet has effective heat dissipation represents a great improvement in the field of LED manufacture and satisfies a long felt need of the lighting engineer.

SUMMARY OF THE INVENTION

In view of the foregoing discussion, it is an object of this invention to provide a structure for and a method of manufacturing a wafer-level bonded LED, so that the heat dissipation is effective and the package area is small. This is achieved through a vertically structured LED array design.

The vertically structured LED array light source comprises or consists of two or more bonded LED array layers of the same dimension. Each LED layer consists of a matrix of LED devices with metallic bonding posts on top of the layer surface. The bonding posts are coated with thin film solder containing Gold and Indium, and the bonding process occurs at the wafer level. The two LED wafers are pressed together and reflowed at elevated temperature to produce a bonded wafer stack of LED arrays. The metallic bonding posts, arranged in a scattered grid and connected fence configurations, produce a narrow cavity separating the LED arrays vertically. Internal circular vias are also provided throughout the LED array layers to provide the necessary electrical connection for the active LED layers. More specifically, the internal circular vias electrically connect the cladding layers of the LED array layers. Because the multitude of via tends to restrict light transmission inside the wafer layer, they increase light extraction efficiency out of the LED array stack. In all embodiments, the light intensity produced by the wafer bonded LED array has been modeled to be 50%-80% more than a single layered LED array. The net effect is that while the sum of lights generated by two LED active layers are less due to the attenuation of the light of the bottom layer by the top layer, the light intensity per area increases for a vertically structured LED array stack.

In some embodiments, the light may be generated as a combination of blue LED array stack and a yellow phosphor. In such embodiments, the LED array typically comprises a LED matrix where GaN is used for the active layer, together with a YAG phosphor deposited on the outside surface of the wafer that emits yellow light. In other embodiments, a polychromatic light may be generated by bonding a plurality of LED arrays such as those resulting from InGaN and AlGaInP, together with appropriate phosphors deposited on the outside surface of the wafer that emit red, green or blue light.

The structures of the various embodiments may be fabricated in a number of ways, depending on whether a semiconductor or insulator substrate is preferred. Various substrates may be used: gallium nitride (GaN), silicon (Si), and silicon carbide (SiC) are examples of conductive substrates, while sapphire and diamond are examples of an isolative substrate.

In a first fabrication process involving a semiconductor substrate such as SiC, a GaN buffer layer is formed above the SiC, and above that is formed a GaN cladding layer. An active layer, typically of InGaN material, is formed above the cladding layer, and another cladding layer is thereafter formed above the active layer. Each of these layers is typically formed by metal-organic chemical vapor deposition (MOCVD) or molecular beam epitaxy (MBE). In a typical arrangement, the substrate and the first cladding layer are n-type material, while the second cladding layer is p-type material. The use of n-type or p-type material may be switched if desired as long as layers of like type remain of like type.

Following the MOCVD or MBE growth each layer, the structure is dry plasma etched to form vias through the wafer at different locations. Afterwards, the wafer is mechanically thinned to a desired thickness. Typically this thickness is in the 25-150 microns range. Electrodes are then formed by either evaporation or plating on the bottom of the substrate and on top of the LED device. Depending on the particular effect desired, the electrodes may be selectively connected to form a circuitry that becomes in series or in parallel after wafer bonding. Gold metal posts and solder coatings are then plated onto the LED surface at various locations, either as isolated grids or in a connected fence pattern.

If silicon substrates are to be used, an aluminum nitride (AlN) buffer layer may be substituted for the GaN buffer layer in the above process.

The wafer stack is formed by aligning two LED array wafers vertically in an oven. The two aligned wafers are then solder reflowed under a few atmosphere inert gas pressures to form an integrated stack. After the wafer bonding process, a phosphor layer is then deposited on the back of the wafer stack. The LED wafer is then diced into smaller units of arrays according to the designed use.

Because metal posts can be arranged as a solid wall to surround the active LED layers, the completed LED array has all the active layer fenced in and is intrinsically hermetically sealed. No protective microelectronic hybrid packaging is required as is necessary in the prior art. The LED array is readily available for assembling onto boards or modules that comprise a solid state light source. As will be evident later in the detailed description, the LED array provided by this invention typically has a general reduction in area from a few square inches to a few centimeters.

The details of the vertically structured LED array of the present invention will be better appreciated from the following detailed description of the invention, taken together with the appended Figures.

DETAILED DESCRIPTION OF THE PREFERRED EMBODIMENT

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed.

Figure 1:
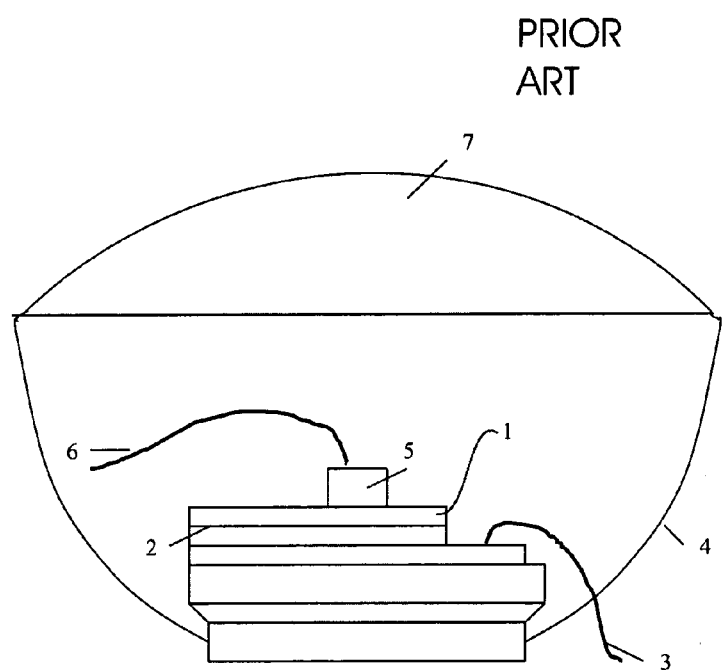
FIG. 1 shows a prior art blue LED formed with a YAG phosphor layer.
Figure 2:
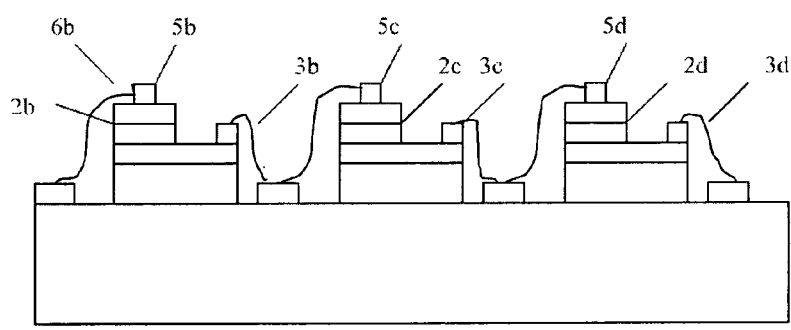
FIG. 2 shows a prior art solid state light panel with twelve individual LEDs.
Figure 3A:
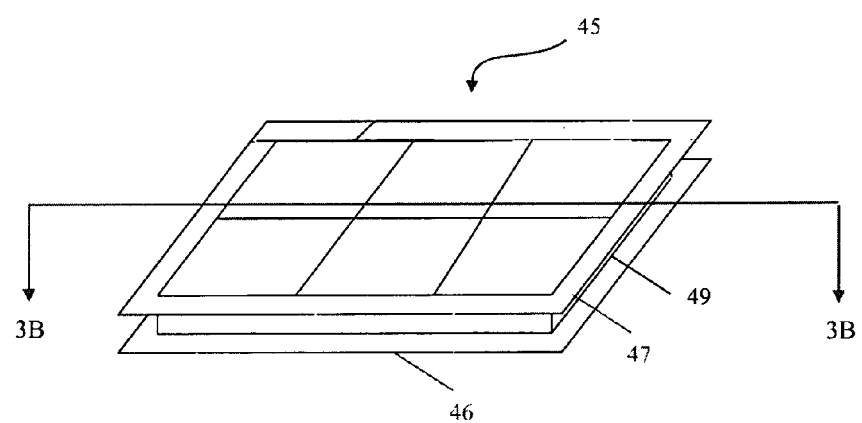
FIG. 3A shows a first embodiment of a vertical structured LED array with 6 devices in a 3×2 rectangle form
Figure 3B:
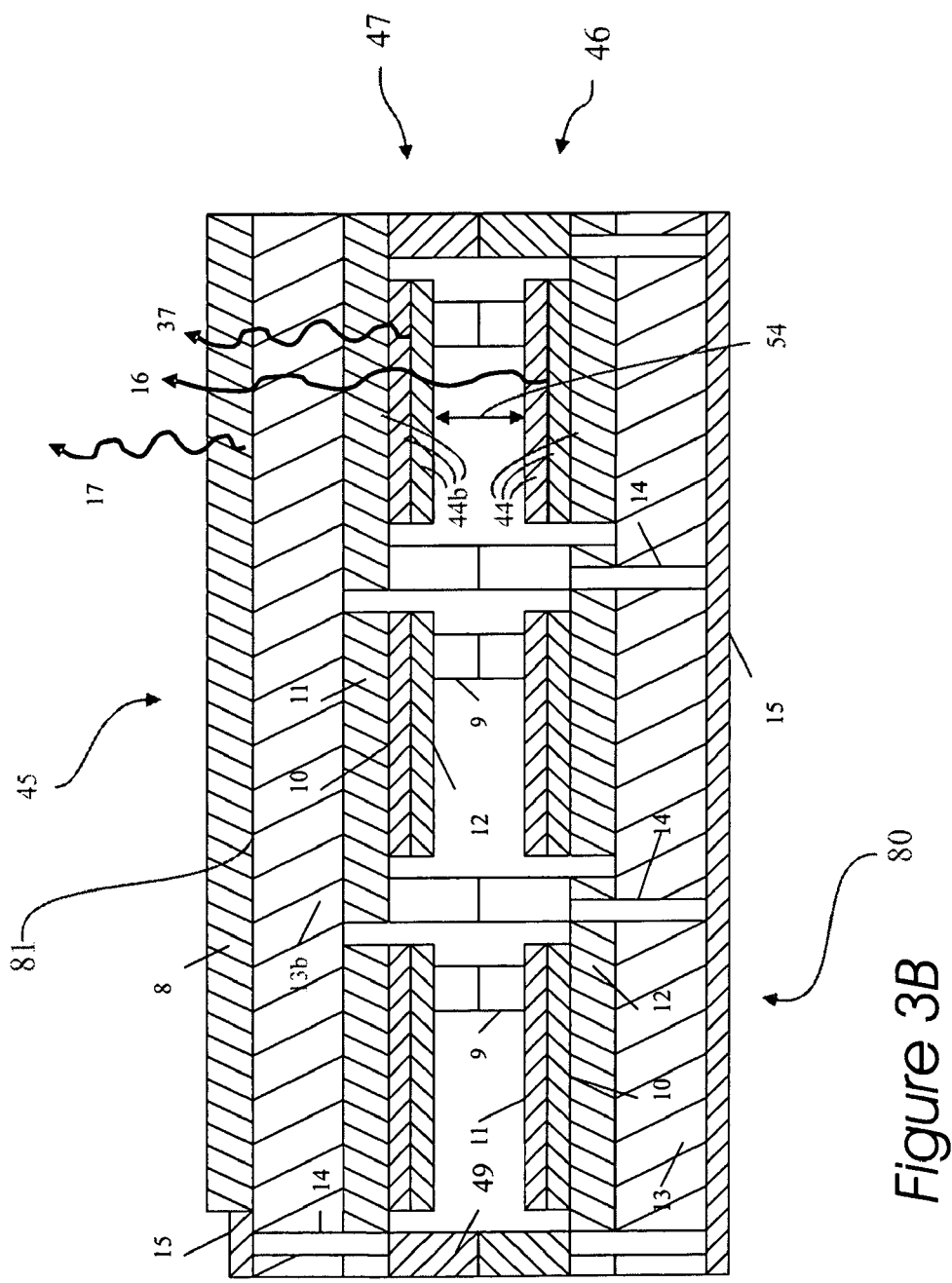
FIG. 3B shows the cross section of the bonded LED array with metal bond posts and a phosphor coating

Referring to FIGS. 3A and 3B, a generalized embodiment of the present invention may be better understood in which a single type of phosphor is used. In simplified terms, two LED layers 44, 44b are formed on two substrates 13, 13b. The individual wafers 46, 47 are bonded together using a plurality of metallic posts 9 and metal walls 49 coated with solder layers to form an integrated LED array stack 45. The two LED layers 46 and 47 are parallel to each other. Phosphor coating 8 is applied to the back 81 of the stack 45.

The detail is further expanded in the cross sectional view of FIG. 3B. Here three identical LED cell structures 80 are shown, and the same feature explained for one cell applies to all in the LED array 45. One substrate 13 is a group III nitride compound. Semiconductor active layer 10 is formed on a substrate 13 and bounded above and below by cladding layers of opposite conduction 11 and 12 (one is n-type material, and the other is p-type material), respectively, to form an epitaxial LED layer 44. Passage of a current through the active layer 10 causes carrier injection into the active layer 10 which leads to emission of light of a first frequency, indicated at 16, when holes and electrons in the semiconductor recombine. On a second substrate 13b, an identical epitaxial LED layer 44b is formed. The second substrate 13b and LED epitaxial layer 44b is flipped to join the first substrate 13 and LED epitaxial layer 44 at metallic posts 9 and metallic walls 49. Typically, the metallic posts 9 are gold and the solder contains indium. The posts 9 are of two types. One type forms part of the electrical circuitry and carries current. The other type does not carry current, is used to carry heat, and can be called a thermal post. For purposes of clarity, the thermal posts are not shown on FIG. 3B. Preferably, there are 10-100 posts 9 separating the two LED surfaces, with the diameter of the posts 9 varying from 10-100 microns. A wall 49 surrounds the 2×3 LED area, making the vertically structured LED array 45 hermetically sealed. Typically, the height of the posts 9 or the wall 49 determines the cavity height 54, which is between 5 to 50 microns. The light 16 emitting from the active layers 10 of the first LED epitaxial layer 44 combines together with a similar light 37 emitting from the second epitaxial layer 44b into a phosphor 8 deposited at the back 81 of the second wafer 47. The light 16 and 37 excite the phosphor 8, in turn causing the phosphor 8 to emit light 17 of a second frequency. By carefully controlling the frequencies of light 16 and 37 polychromatic light 17 perceived by a viewer may be of a selected resultant frequency. For example, for a blue LED with a yellow phosphor 8. The combination of blue and yellow emissions may be controlled to yield white light. In a typical arrangement, the active layers 10 may be $In_xGa_{1-x}N$ wherein x defines the indium mole fraction, while the cladding layers 11 and 12 are of opposite conduction types. The phosphor 8 is typically YAG in such an embodiment. The vertically structured LED array stack 45 contains many vias 14 through the individual LEDs 46 and 47. The vias 14 allow electrical connection from the metal layer 15 to the top of cladding layer 12, passing through the substrate 13. The vias 14 are plasma dry etched, and are typically 5-25 microns in diameter. The heights of the vias 14 are about the thickness of the individual LED layers 46 and 47, typically 25-150 microns.

Figure 4:
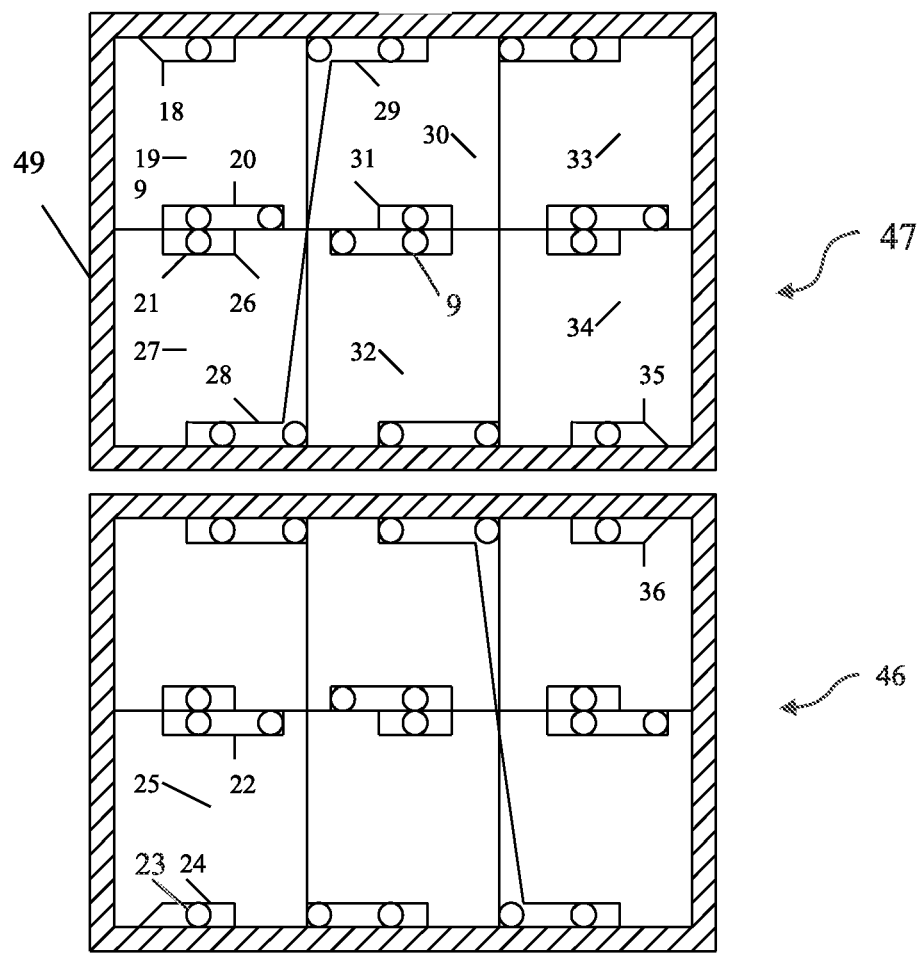
FIG. 4 is a view of the embodiment of FIG. 3A, 3B with the layers separated to show the LED devices.

The generalized embodiment 45 shown in FIGS. 3A and 3B is further illustrated in FIG. 4 which is an exploded view of the LED array structure separated at the metallic posts 9. The circular dots here represent the metallic posts 9 and the hatched rims represent the metallic walls 49 where the two LED arrays 46, 47 are joined to form an integrated wafer stack. In this structure, a current is injected from lead pad 18 to the LED chip 19, and exits to a conductor pad 20 and the current flows from the pad 20 to the metal post 21. The metallic post 21 allows pad 20 and pad 22 to be connected, and metallic post joint 23 allows pad 18 and pad 24 to be connected, allowing currents flows from pad 24 to the LED chip 25, and exits to pad 22. In this example, the two LED arrays on the opposite wafers are jointed in parallel in the wafer bonded stack. By a carefully arranged metallic post locations and metallic trace placement, the LED chips on the same wafer can be made to become in series with each other in the wafer bonded stack. Therefore, current flows through metal post 21 to pad 26, and current flows from pad 26 to the LED chip 27, and exit to pad 28. This current continues flowing through into the next matrix location, and current will flow from Pad 29 to LED chip 30, and exits pad 31. Notice that because the current flows from pad 28 to pad 29, and the LED chip 27 and LED chip 30 are connected in series. The current flows in series from LED chip 30 to LED chip 32, in series from LED chip 32 to LED chip 33, and finally in series from LED chip 33 to LED chip 34. The current eventually flows from LED chip 34 to pad 35. Since metallic posts connect pad 35 and pad 36, the current exits the wafer bonded stack 45 at pad 36.

Figure 5:
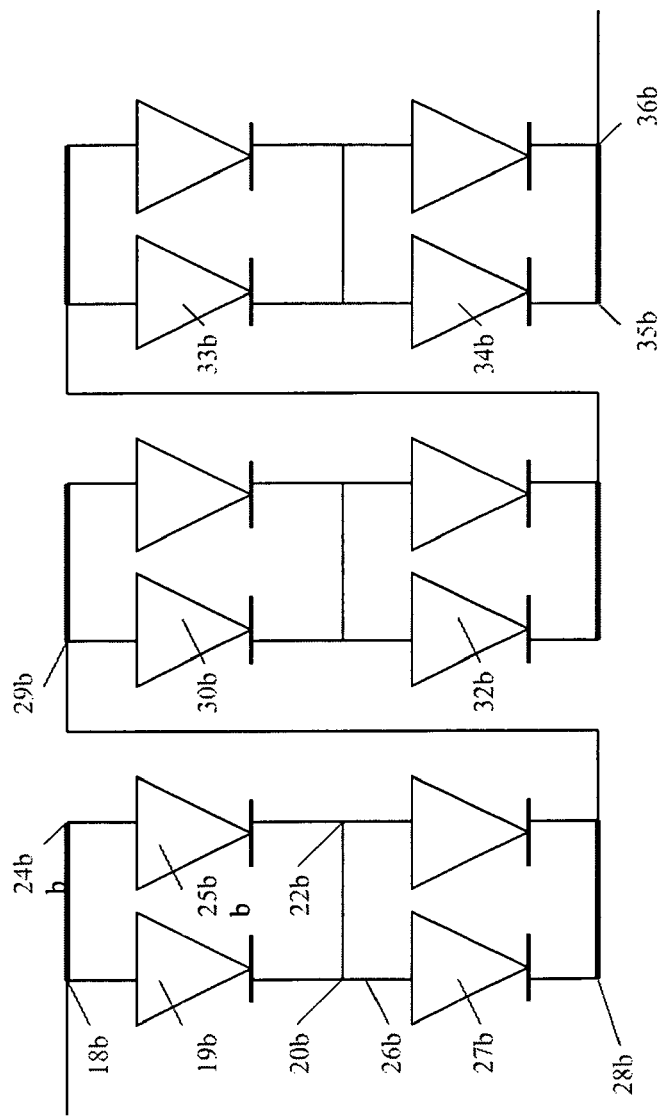
FIG. 5 shows an equivalent LED circuits diagram for the LED array displayed in FIG. 3A, 3B

A circuit diagram for FIGS. 3A, 3B and 4 is shown in FIG. 5. The currents injected from pads 18b and 24b to activate the LED diodes 19b and 25b, and flows out through pads 20b and 22b. The current continues from pad 26b to activate LED diode 27b and flows out to pad 28b. The current continues to pad 29b, and to activate LED diodes 30b, 32b, 33b, and 34b. The remaining current exits out of the posts 35b and 36b. Assuming that each diode 19b, 25b, etc. will generates a current of 700 mA at a voltage setting of 3 Volt with 100 lumens/Watt efficiency, the LED array 45 in example of FIGS. 3A, 3B and 4 can be operative up to 25 watts to yield approximately 1800-2200 lumens of light.

Figure 6:
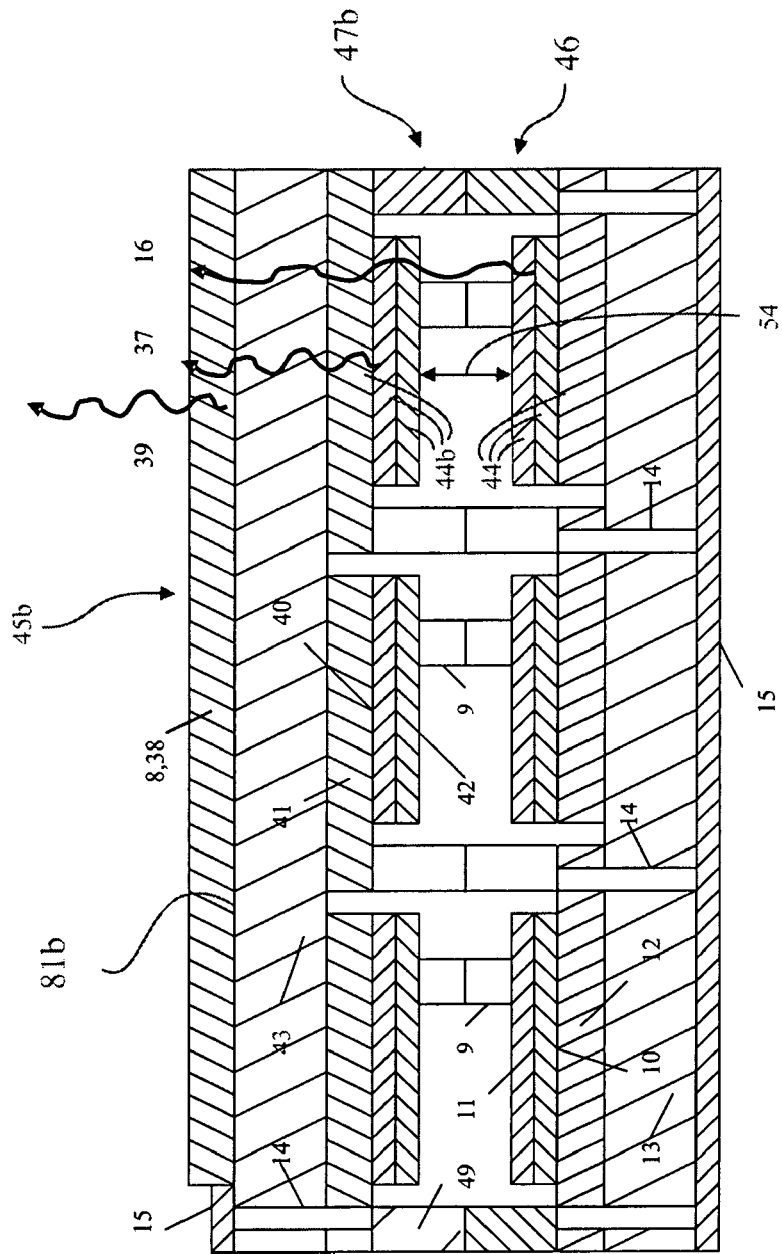
FIG. 6 is a cross-section of a second embodiment of a vertically structured LED array stack where the two LEDs are of a different kind FIG. 7 a cross-section of a third embodiment of a vertically structured LED array where the LED stacks comprise two substrates of the same kind with UV LED arrays.

A generalized second embodiment 45b may be understood, referring to FIG. 6, again in simplified terms, in which two different type of LED structures 46 and 47b are wafer bonded and a phosphor 8 or a plurality of phosphors 38 are used with the combined emitted light providing the desired spectrum. For clarity, elements similar to those shown in FIG. 3B are indicated with like numerals. Elements in the second LED structure 47b are shown with different numerals. In the embodiment of FIG. 6, a plurality of active layers 40 may again be formed on a substrate generally indicated at 43. The active layers 40 are again bounded above and below by cladding layers 41 and 42 of opposite conduction polarity. Unlike the prior embodiment of FIG. 3B, however, the active layer of FIG. 6 for one of the LED is AlGaInP, which emits red light, and the cladding layers 41 and 42 are of GaP. As an example of this embodiment, blue LED array 46 and red LED array 47b can be bonded with a green phosphor 38 applied to the back 81b of the top wafer 47b. By carefully controlling the first frequency of light 16 and first frequency of light 37, polychromatic light emission 39 perceived by a viewer will be white light.

Figure 7:
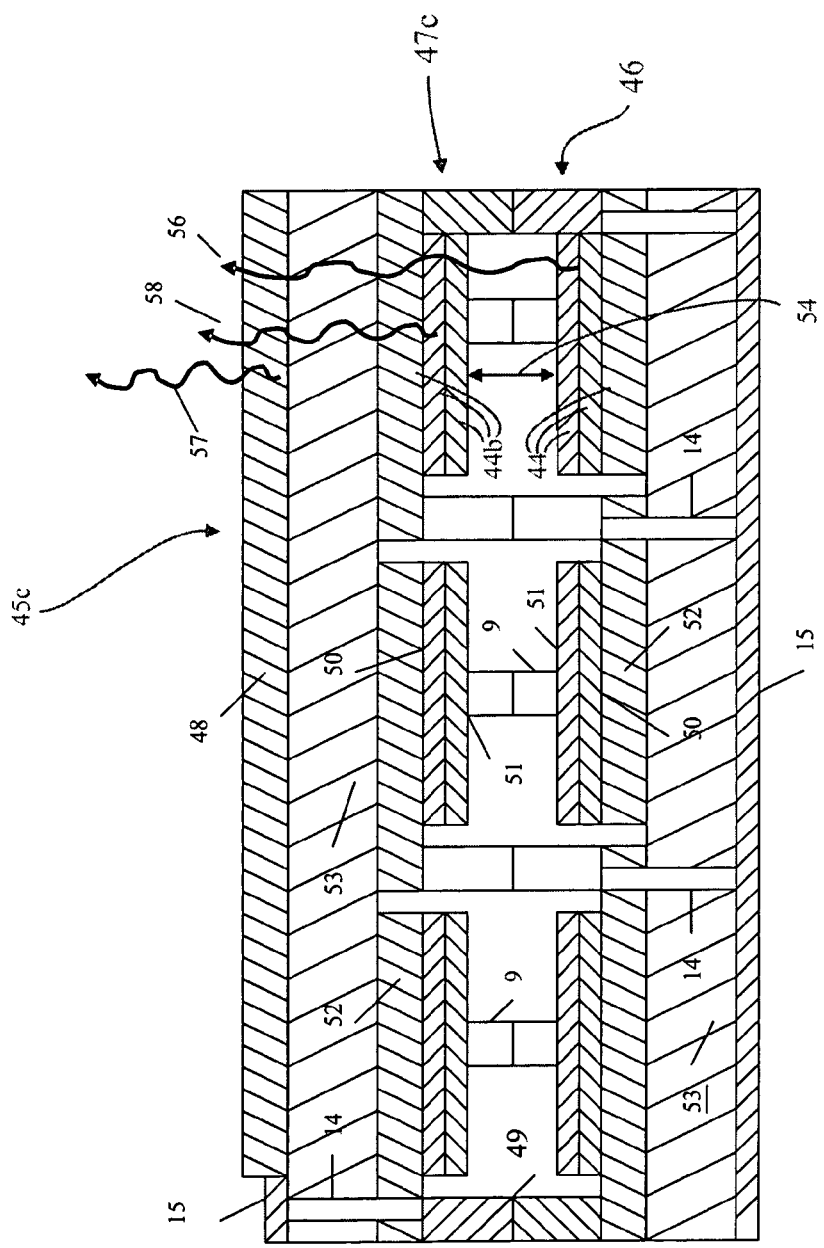

A generalized third embodiment 45c may be understood, referring to FIG. 7, again in simplified terms, in which the wafer stack 45c bonds two LED structures 46 and 47c of the same type, which is of UV-LED type, and a special type of phosphor # sensitive to UV is used with the combined emitted light providing the desired spectrum. For clarity, elements similar to those shown in FIG. 3B are indicated with like numerals. Elements in the UV-LED structure 47c are shown with different numerals. In the embodiment of FIG. 7, a plurality of active layers 50 may again be formed on a substrate generally indicated at 53. The active layers 50 are again bounded above and below by cladding layers 51 and 52 of opposite conduction types. Unlike the prior embodiment of FIG. 3, however, the active layer of FIG. 7 for the LED array is $Al_xGa_{1-x}N$, wherein x defines the Al mole fraction. For this embodiment 45c, because the LED light is in UV, the second frequency of light 57 is controlled by the first frequency of light 56 and 58. By carefully controlling the first frequency of light 56 and 58 the second light 57 will be polychromatic and perceived by a viewer to be white light. Vias 14 again allow electrical connection from the metal layer 15 to the top of surface layer 52 through the substrate 53.

Figure 8:
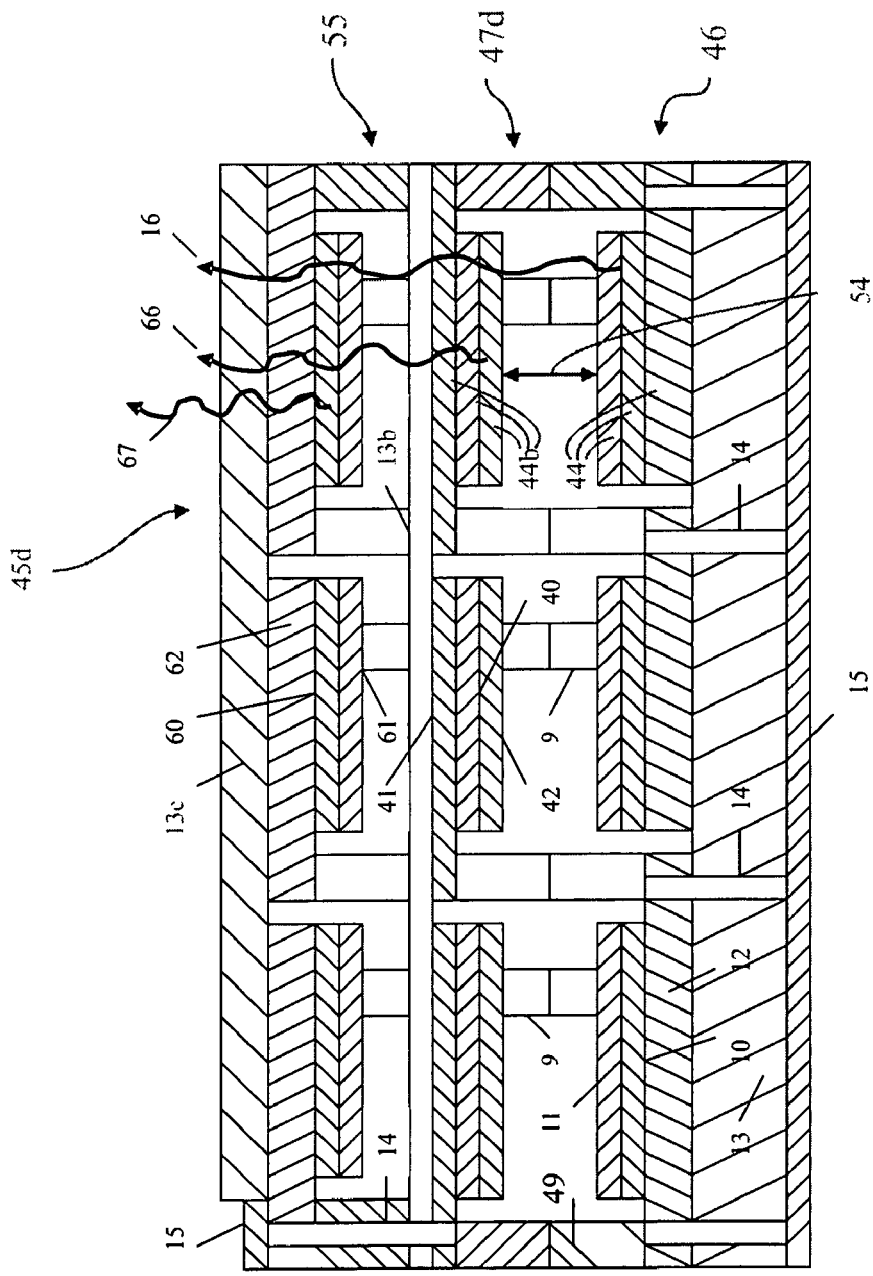
FIG. 8 a cross-section of a fourth embodiment of a vertically structured LED array where a third LED structure is added to the two-LED stacks phosphor is not used.

A generalized fourth embodiment 45d may be understood, referring to FIG. 8, again in simplified terms, in which the wafer stack 45d bonds three types of LED structures 46, 47d and 55, with the combined emitted light providing the desired spectrum. In this embodiment there is no phosphor layer. For clarity, elements similar to those shown in FIG. 3B are indicated with like numerals. Elements in the fourth vertical LED array structure 55 are shown with different numerals. In the embodiment of FIG. 8, a plurality of active layers 60 may again be formed on a substrate generally indicated at 13c. The active layers 60 are again bounded above and below by cladding layers 61 and 62 of opposite conduction type. Unlike the prior embodiment of FIG. 4B, however, the active layer of FIG. 8 for one of the LEDs 55 is $In_xGa_{1-x}N$, wherein x defines the indium mole fraction. For this embodiment 45d, unlike the other embodiments 45, 45b, 45c, which use phosphor to generate a second light, all lights 16, 66, 67 are first lights, and the first light frequency light 67 is independently controlled, as are lights 16 and 66. By carefully combining the frequencies of lights 16, 66 and 67, polychromatic light emission perceived by a viewer will be white light. For example, if light 16 is blue (B) and light 66 is red (R), a white light will be generated if light 67 is green (G).

Figure 9:
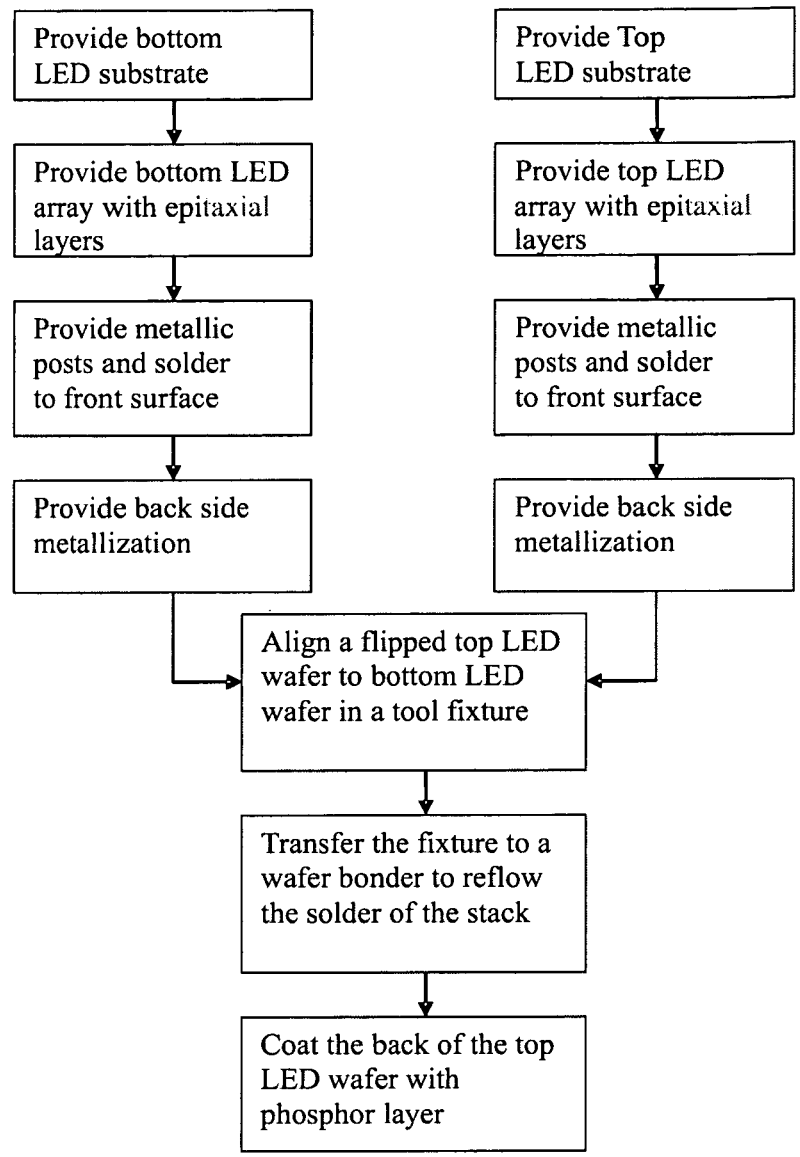
FIG. 9 a cross-section of a fabrication process flow of a vertically structured LED stack of the embodiments displayed in FIGS. 3 through 8.

In all embodiment 45, 45b, 45c, 45d of the present invention, the use of a low temperature solder coating is the key to make wafer level bonding possible. The process flow is described in FIG. 9. Individual LED wafers 46 and 47 are provided with a thickness of 25-150 microns, preferably, 50 microns. The alignment process flips the top LED wafer 47 and aligns it to the bottom wafer 46 in a tool fixture containing a vacuum chuck. In the wafer bonding process the fixture is loaded into a wafer bonder to reflow the solder above its eutectic temperature. For gold/indium, the reflow temperature is 185-195 C. Stress and strain due to mismatch of thermal expansion coefficient of the various materials in the LED arrays 47, 47b, 47c could cause warpage during the cooling phase of bonding. This is minimized by carefully controlling the heating and cooling process during bonding. After the wafer bonding, the phosphor layer 8, 38, or 48, is applied to the back of the top LED wafer 47 by dipping the wafer 45, 45b, 45c in a buffer solution containing the phosphor followed by drying.

Figure 10:
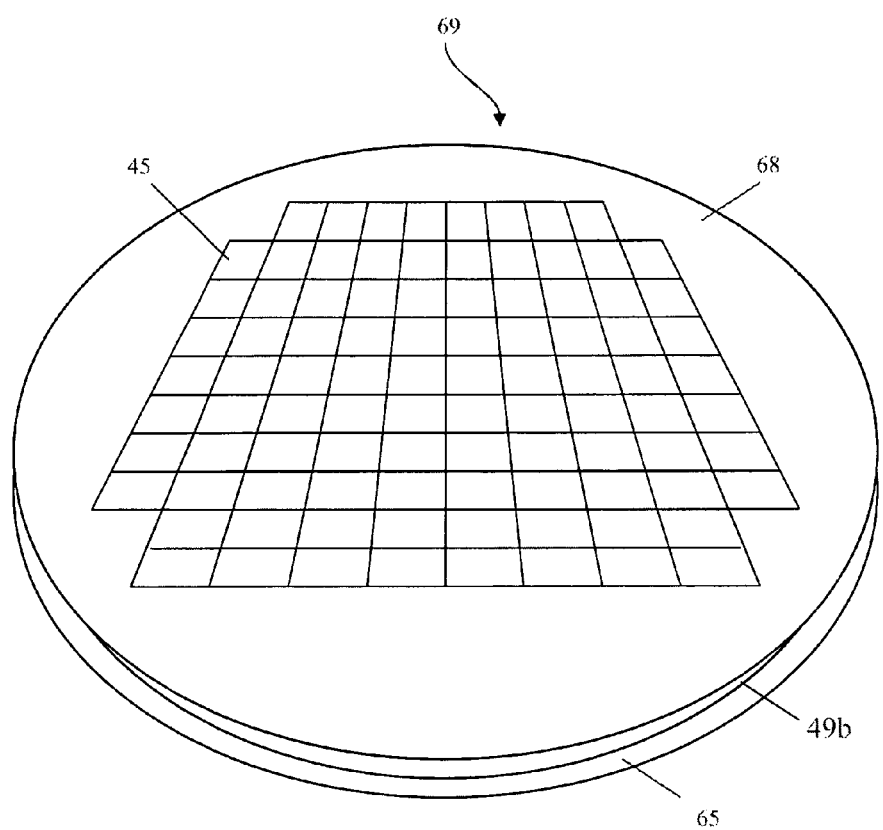
FIG. 10 shows a completed wafer-level bonded LED wafer comprising many vertically structured LED arrays.

A completed wafer bonded, vertically structured LED array 69 is displayed in FIG. 10 for a 2" wafer stack. The outer rims 49b between the wafers 65 and 68 and the walls 49 (not shown for the purposes of clarity) between each LED array are made of Au/In. Since conventional wafer processing is utilized, the size of the wafer could vary from 2" to 8" (i.e. 2" 3", 4", 5", 6", 8"). After dicing, the subset of the LED arrays 45 may be in any form, the most common being a rectangle, as displayed in FIGS. 3 through 9. For example, a 2×3 LED array could be of a dimension of 2.8 mm×4.2 mm, with individual LED device of 2 mm². The power required to drive such LED arrays is equivalent to driving a conventional LED light source of several square inches. This illustrates the great reduction in size possible with the present invention.

Thus, the present invention has been described herein with reference to particular embodiments for particular applications. Those having ordinary skill in the art and access to the present teachings will recognize additional modifications, applications and embodiments within the scope thereof. It is therefore intended by the appended claims to cover any and all such applications, modifications and embodiments within the scope of the present invention.

What is claimed is:

1. A hermetically sealed LED semiconductor structure comprising:
    a) a first LED layer on a first substrate, said first LED layer having a front surface and a back surface, said first substrate having multiple through substrate first vias, said through substrate first vias connecting said first LED layer to said back surface of said first substrate;
    b) a second LED layer on a second substrate, said second LED layer having a front surface and a back surface, said second substrate having multiple through substrate second vias, said through substrate second vias connecting said second LED layer to said back surface of said second substrate, said second LED layer being of a different type of semiconductor material than said first LED layer;
    c) a plurality of metal posts attached to said front surfaces, said first LED layer attached to said second LED layer by said metal posts;
    d) a continuous metal wall attached to said front surfaces, said metal wall surrounding said first and second LED layers and said metal posts and forming a hermetic seal around said structure;
    e) a coating of metal on said back surfaces; and
    f) a phosphor coating on one of said back surfaces.

2. A hermetically sealed LED semiconductor structure as claimed in claim 1 in which said first and second LED layers are of different kinds.

3. A hermetically sealed LED semiconductor structure as claimed in claim 1 in which said phosphor is YAG.

4. A hermetically sealed LED semiconductor structure as claimed in claim 1 in which said first and second LED layers comprise:
    an active layer;
    a first cladding layer on one side of said active layer; and
    a second cladding layer on the other side of said active layer; said first and second cladding layers being of different conductivity types; said cladding layers being electrically connected via a plurality of vias.

5. A hermetically sealed LED semiconductor structure as claimed in claim 4 in which said active layer is selected from the group consisting of $In_xGa_{1-x}N$, AlGaInP, and $Al_xGa_{1-x}N$.

6. A hermetically sealed LED semiconductor structure as claimed in claim 4 in which said cladding layer is GaP.

\* \* \* \* \*